United States Patent
Beaman et al.

(10) Patent No.: US 8,486,250 B2
(45) Date of Patent: Jul. 16, 2013

(54) ELECTRODEPOSITION METHOD OF FORMING A PROBE STRUCTURE HAVING A PLURALITY OF DISCRETE INSULATED PROBE TIPS PROJECTING FROM A SUPPORT SURFACE

(75) Inventors: Brian Samuel Beaman, Apex, NC (US); Keith Edward Fogel, Mohegan Lake, NY (US); Paul Alfred Lauro, Nanuet, NY (US); Yun-Hsin Liao, Tempe, AZ (US); Daniel Peter Morris, Purchase, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1974 days.

(21) Appl. No.: 10/066,171

(22) Filed: Feb. 1, 2002

(65) Prior Publication Data
US 2002/0089344 A1    Jul. 11, 2002

Related U.S. Application Data

(62) Division of application No. 09/254,798, filed on Mar. 11, 1999, now Pat. No. 6,452,406.

(60) Provisional application No. 60/026,050, filed on Sep. 13, 1996.

(51) Int. Cl.
*C25D 5/02* (2006.01)
*C25D 9/02* (2006.01)
*C25D 13/06* (2006.01)
*G01R 1/073* (2006.01)

(52) U.S. Cl.
USPC .......... 205/122; 204/489; 205/149; 205/317; 324/755.02

(58) Field of Classification Search
USPC .......................................... 205/122, 149, 317
See application file for complete search history.

(56) References Cited

U.S. PATENT DOCUMENTS

| | | | | |
|---|---|---|---|---|
| 3,878,145 A | * | 4/1975 | Guldenpfennig | 525/530 |
| 4,039,415 A | * | 8/1977 | Shibayama et al. | 204/488 |
| 4,739,259 A | * | 4/1988 | Hadwin et al. | 324/761 |
| 5,233,011 A | * | 8/1993 | Saruwatari et al. | 528/73 |
| 5,476,211 A | * | 12/1995 | Khandros | 228/180.5 |
| 5,525,911 A | * | 6/1996 | Marumo et al. | 324/754 |
| 5,665,610 A | * | 9/1997 | Nakata et al. | 438/18 |
| 5,806,181 A | * | 9/1998 | Khandros et al. | 29/874 |
| 6,110,823 A | * | 8/2000 | Eldridge et al. | 438/660 |

* cited by examiner

*Primary Examiner* — Patrick Ryan
*Assistant Examiner* — William Leader
(74) *Attorney, Agent, or Firm* — Daniel P. Morris

(57) ABSTRACT

The present invention is directed to structures having a plurality of discrete insulated elongated electrical conductors projecting from a support surface which are useful as probes for testing of electrical interconnections to electronic devices, such as integrated circuit devices and other electronic components and particularly for testing of integrated circuit devices with rigid interconnection pads and multi-chip module packages with high density interconnection pads and the apparatus for use thereof and to methods of fabrication thereof. Coaxial probe structures are fabricated by the methods described providing a high density coaxial probe.

23 Claims, 16 Drawing Sheets

ELECTRODEPOSITION METHOD OF FORMING A PROBE STRUCTURE HAVING A PLURALITY OF DISCRETE INSULATED PROBE TIPS PROJECTING FROM A SUPPORT SURFACE

This application is a Division of application U.S. Ser. No. 09/254,798, filed on Mar. 11, 1999, issued as U.S. Pat. No. 6,452,406, which claims priority from Provisional Application U.S. Ser. No. 60/026,050 filed on Sep. 13, 1996.

CROSS REFERENCE TO RELATED APPLICATION

The teaching of U.S. application Ser. No 09/254,768 filed on the same day herewith entitled, "INTEGRATED COMPLIANT PROBE FOR WAFER LEVEL TEST AND BURNIN" to Brian S. Beaman et al., now issued as U.S. Pat. No. 6,528,984 and the teaching of U.S. application Ser. No. 09/254,769 filed on the same day herewith entitled, "WAFER SCALE HIGH DENSITY PROBE ASSEMBLY, APPARATUS FOR USE THEREOF AND METHODS OF FABRICATION THEREOF" to Brian S. Beaman et al., now issued as U.S. Pat. No. 7,282,945 is incorporated herein by reference.

FIELD OF THE INVENTION

The present invention is directed to structures having a plurality of discrete insulated elongated electrical conductors projecting from a support surface which are useful as probes for testing of electrical interconnections to electronic devices, such as integrated circuit devices and other electronic components and particularly for testing of integrated circuit devices with rigid interconnection pads and multi-chip module packages with high density interconnection pads and the apparatus for use thereof and to methods of fabrication thereof.

BACKGROUND OF THE INVENTION

Integrated circuit (IC) devices and other electronic components are normally tested to verify the electrical function of the device and certain devices require high temperature burn-in testing to accelerate early life failures of these devices. Wafer probing is typically done on a single chip site at temperatures ranging from 25 C.-125 C. while burn-in is typically done on diced and packaged chips at temperatures ranging from 80 C. to 150 C. Wafer probing and IC chip burn-in at elevated temperatures of up to 200 C. has several advantages and is becoming increasingly important in the semiconductor industry. Simultaneous testing of multiple chips on a single wafer has obvious advantages for reducing costs and increasing production throughput and is a logical step towards testing and burn-in of an entire wafer.

The various types of interconnection methods used to test these devices include permanent, semi-permanent, and temporary attachment techniques. The permanent and semi-permanent techniques that are typically used include soldering and wire bonding to provide a connection from the IC device to a substrate with fan out wiring or a metal lead frame package. The temporary attachment techniques include rigid and flexible probes that are used to connect the IC device to a substrate with fan out wiring or directly to the test equipment.

The permanent attachment techniques used for testing integrated circuit devices such as wire bonding to a leadframe of a plastic leaded chip carrier are typically used for devices that have low number of interconnections and the plastic leaded chip carrier package is relatively inexpensive. The device is tested through the wire bonds and leads of the plastic leaded chip carrier and plugged into a test socket. If the integrated circuit device is defective, the device and the plastic leaded chip carrier are discarded.

The semi-permanent attachment techniques used for testing integrated circuit devices such as solder ball attachment to a ceramic or plastic pin grid array package are typically used for devices that have high number of interconnections and the pin grid array package is relatively expensive. The device is tested through the solder balls and the internal fan out wiring and pins of the pin grid array package that is plugged into a test socket If the integrated circuit device is defective, the device can be removed from the pin grid array package by heating the solder balls to their melting point. The processing cost of heating and removing the chip is offset by the cost saving of reusing the pin grid array package.

The most cost effective techniques for testing and burn-in of integrated circuit devices provide a direct interconnection between the pads on the device to a probe sockets that is hard wired to the test equipment Contemporary probes for testing integrated circuits are expensive to fabricate and are easily damaged. The individual probes are typically attached to a ring shaped printed circuit board and support cantilevered metal wires extending towards the center of the opening in the circuit board. Each probe wire must be aligned to a contact location on the integrated circuit device to be tested. The probe wires are generally fragile and easily deformed or damaged. This type of probe fixture is typically used for testing integrated circuit devices that have contacts along the perimeter of the device. This type of probe is also much larger than the IC device that is being tested and the use of this type of probe for high temperature testing is limited by the probe structure and material set. This is described with reference to applicant's co-pending U.S. application Ser. No. 08/754,869 filed on Nov. 22, 1996, the teaching of which is incorporated herein by reference.

Another technique used for testing IC devices comprises a thin flex circuit with metal bumps and fan out wiring. The bumps are typically formed by photolithographic processes and provide a raised contact for the probe assembly. The bumps are used to contact the flat or recessed aluminum bond pads on the IC device. An elastomer pad is typically used between the back of the flex circuit and a pressure plate or rigid circuit board to provide compliance for the probe interface. This type of probe is limited to flexible film substrate materials that typically have one or two wiring layers. Also, this type of probe does not provide a wiping contact interface to ensure a low resistance connection.

The aluminum bond pads on a high density IC device are typically rectangular in shape and are recessed slightly below the surface of the passivation layer. If the wiping action of the high density probe is not controlled, the probe contact may move in the wrong direction and short to an adjacent aluminum bond pad or the probe contact may move off of the aluminum bond pad onto the surface of the passivation layer and cause an open connection.

The position of the probe tips must be controlled to ensure accurate alignment of the probes to the interconnection pads on the IC device. During high temperature burn-in testing, the thermal expansion mismatch between the probe structure and the IC device must be small to ensure that the probe position does not vary significantly over the burn-in temperature range. Thermal expansion mismatch within the probe structure can result in contact reliability problems.

The challenges of probing a single high density integrated circuit device are further multiplied for multi-chip and full wafer testing applications. Probe fabrication techniques and material selection are critical to the thermal expansion and contact alignment considerations. A small difference in the thermal expansion of the substrate, wafer, and probe construction will cause misalignment of the probe tip to the wafer contact pad. Compliance of the probe structure is another critical factor. Slight variations in the wafer metalization, warpage of the wafer, and slight variations in the probe height contribute to the total compliance requirements for the probe structure.

As the processing power of IC devices increases, the number of I/O and speed of the I/O signals increases to meet this need. The use of high speed signals and high density connections on an integrated circuit device provides an increased challenge to accurately test the function of the device. High inductance of the test probes and cross talk between probes can severely limit the ability to test high speed and high density chip connections. The inductance of the test probe can be reduced by reducing the probe length or by providing a probe structure that has a shield ground. The integral shielding also helps to reduce the cross talk between high density probes and reduces the need to place grounded probes between signal probes.

U.S. Pat. No. 5,177,439, issued Jan. 5, 1993 to Liu et al., is directed to fixtures for testing bare IC chips. The fixture is manufactured from a silicon wafer or other substrate that is compatible with semiconductor processing. The substrate is chemically etched to produce a plurality of protrusions to match the I/O pattern on the bare IC chip. The protrusions are coated with a conductive material and connected to discrete conductive fanout wiring paths to allow connection to an external test system. The probe geometry described in this patent does not provide a compliant interface for testing the aluminum bond pads on the IC device and does not provide a wiping contact interface. The substrate used for fabrication of this probe fixture is limited to semiconductor wafers which are relatively expensive. The high density probe with controlled wipe can be fabricated on a variety of inexpensive substrate with the fanout wiring.

Applicant's co-pending U.S. application Ser. No. 08/754, 869 filed on Nov. 22, 1996, the teaching of which is incorporated herein by reference describes a high density test probe for integrated circuit devices. The probe structure described in this docket uses short metal wires that are bonded on one end to the fan out wiring on a rigid substrate. The wires are encased in a compliant polymer material to allow the probes to compress under pressure against the integrated circuit device. The wire probes are sufficiently long and formed at an angle to prevent permanent deformation during compression against the integrated circuit device.

Objects

It is the object of the present invention to provide a probe for testing integrated circuit devices and other electronic components that use rigid bond pads for the interconnection means.

Another object of the present invention is to provide a probe structure that is an integral part of the fan out wiring on the test substrate or other printed wiring means to minimize the electrical conductor length as well as the contact resistance of the probe interface.

A further object of the present invention is to provide a probe with a compliant interface to compensate for slight variations in the rigid bond pad heights on the IC device and variations in the height of the probe contacts.

An additional object of the present invention is to provide a raised probe tip for contacting recessed surfaces on the IC device.

Yet an another object of the present invention is to provide a probe structure that has low inductance and low cross talk electrical properties.

Yet a further object of the present invention is to provide a probe structure that has an improved true position tolerance.

Yet an additional object of the present invention is to provide a probe structure that can be used for high performance and high frequency single chip or multiple chip wafer testing.

SUMMARY OF THE INVENTION

A broad aspect of the present invention is a structure having a substrate having a surface; a plurality of elongated electrical conductors extending away from the surface; the elongated electrical have a dielectric coating; and each of the elongated electrical conductors having a first end affixed to the surface and a second end projecting away from the surface.

A more specific aspect of the structure according to the present invention includes a coating of an electrically conductive material disposed on the dielectric coating.

Another more specific aspect of the structure according to the structure of the present invention includes a means for electrically interconnection the electrically conductive coating on at least a part of said plurality of elongated electrical conductors.

Another more particular aspect of the present invention is an apparatus for using the structure to test an electronic device having a means for holding the structure, means for retractably moving the structure towards and away from the electronic device so that the second ends contact electrical contact locations on the electronic device and substrate.

Another broad aspect of the present invention is a method of providing a substrate having a surface; providing a plurality of elongated electrical conductors each having a first end and a second end; bonding each of the first ends to the surface so that the second ends are disposed away from the surface; forming a dielectric coating on the elongated electrical conductors.

Another more specific aspect of the method according to the present invention further includes forming a coating of an electrically conductive material on the dielectric coating.

BRIEF DESCRIPTION OF THE DRAWINGS

These and other objects, features, and advantages of the present invention will become apparent upon further consideration of the following detailed description of the invention when read in conjunction with the drawing figures, in which.

showed "C" shaped, continuously curved, piece wire curved, piece wire linear and combinations thereof.

Figure 12:
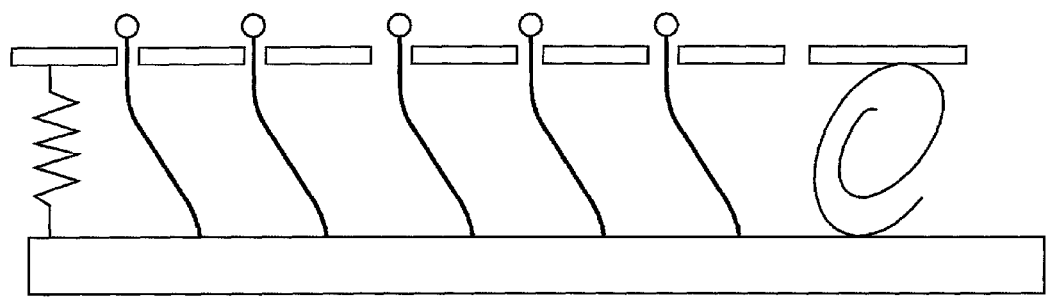

FIG. 12 schematically shows alternative embodiments of compliant frame structure (17) to support probe tip positioning structure (20) to be maintaining in position and to move as the probe tip ends (16) move when they are moved into engagement with electronic pads (31).

Figure 13:
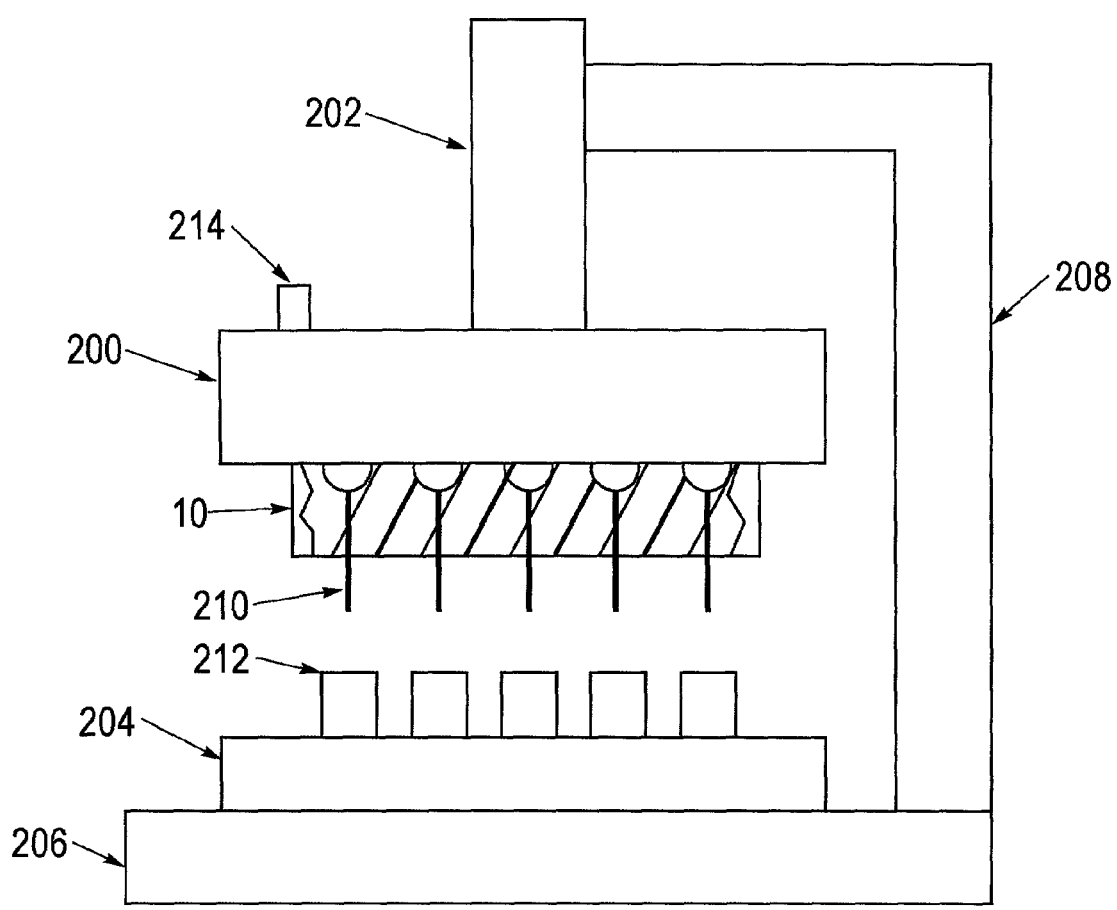
Figure 14:
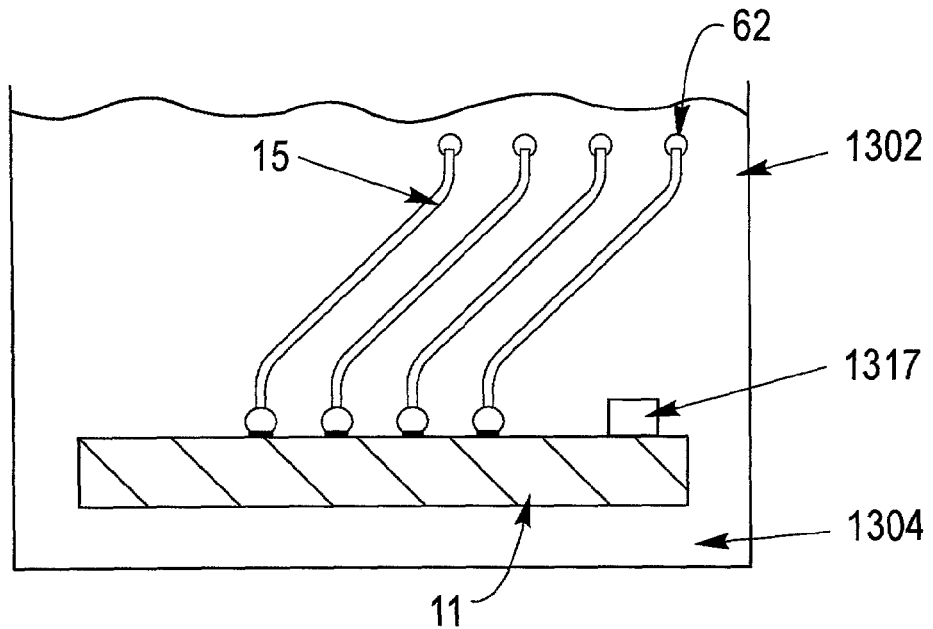

FIG. 13 schematically shows an apparatus for moving the probes according to the present invention into an out of electrical engagement with a workpiece, such as on integrated circuit (IC), being tested.

FIG. 14-17 shows an electrochemical method of fabricating the structures according to the present invention.

Figure 17:
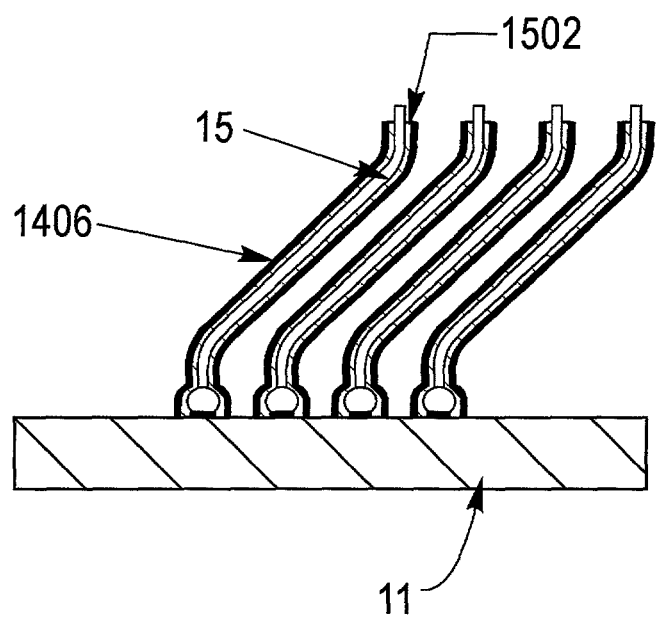
Figure 18:
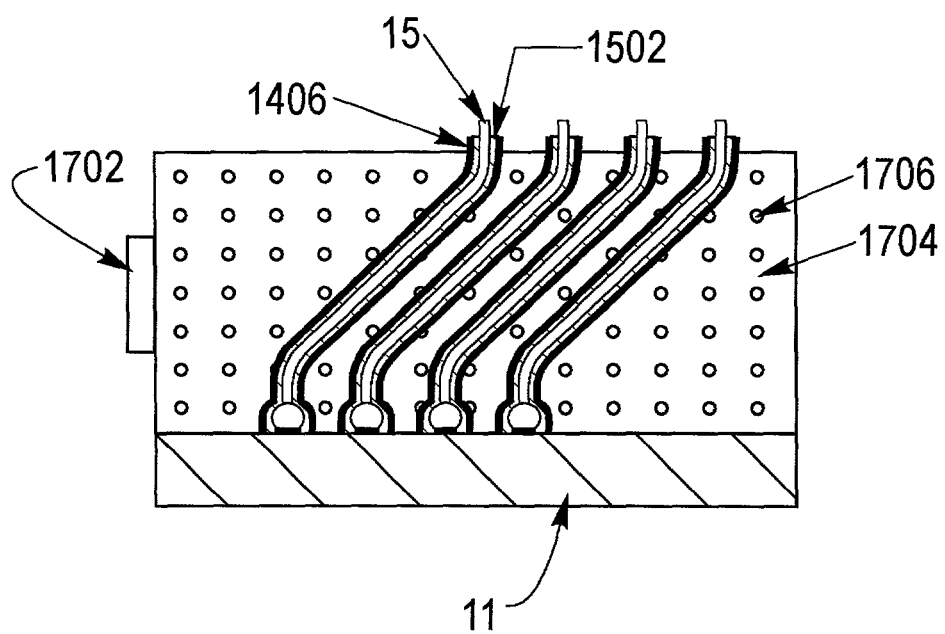
Figure 19:
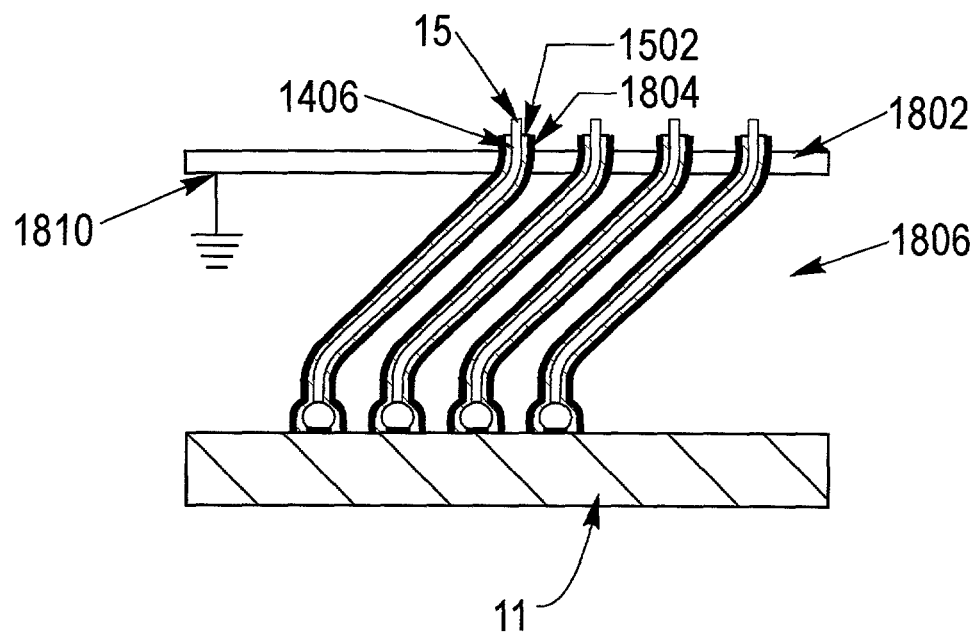
Figure 20:
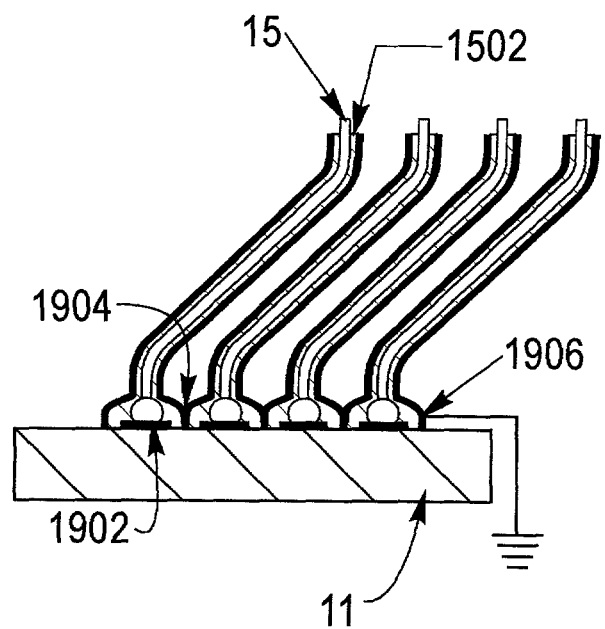

FIG. 18-20 show different structures for forming a corner connection for the outer conductors made by the method of FIGS. 14-17.

DETAILED DESCRIPTION

Figure 1:
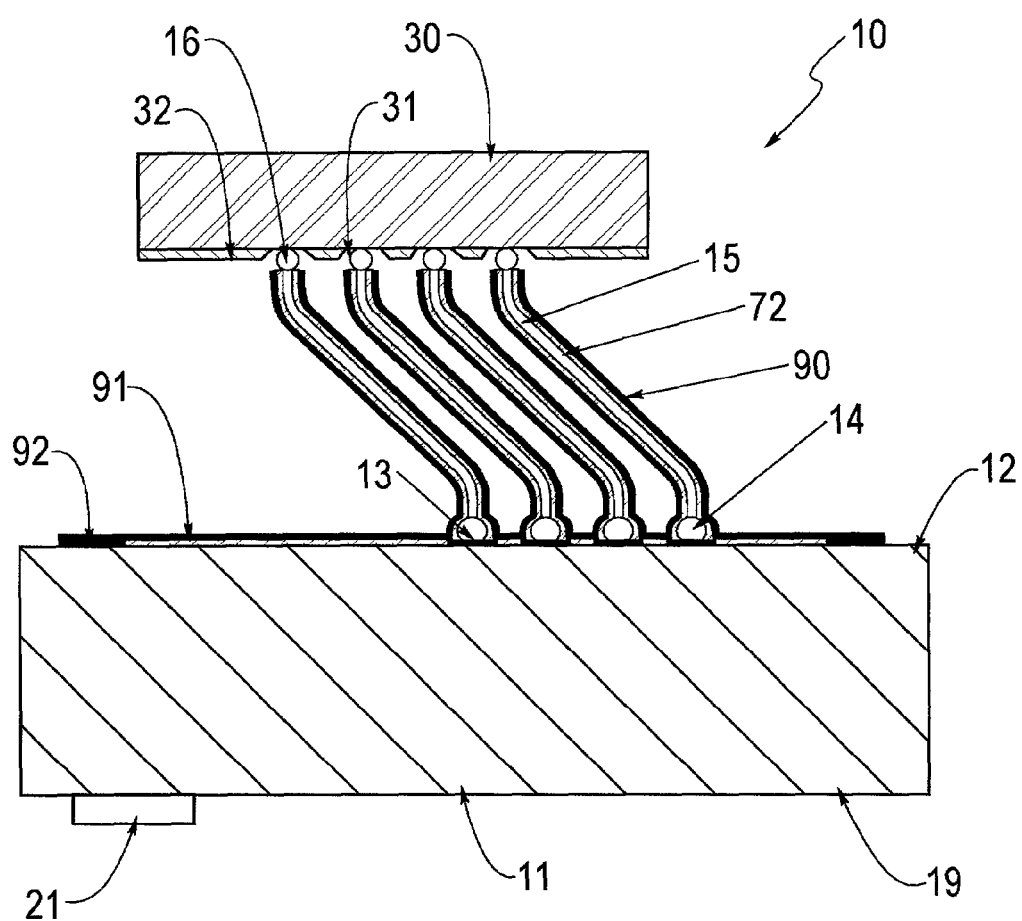
FIG. 1 shows a cross section of the preferred embodiment of the high performance test probe attached to a substrate and pressed against the aluminum bond pads on an integrated circuit device.

FIG. 1 shows a cross section of a test substrate (11) and a high performance test probe (10) according to the present invention. The test substrate (11) provides a rigid base for attachment of the probes (10) and fan out wiring from the high density array of probe contacts to a larger grid of pins or other interconnection means to the equipment used to electrically test the integrated circuit device. The fan out substrate can be made from various materials and constructions including single and multi-layer ceramic with thick or thin film wiring, silicon wafer with thin film wiring, and epoxy glass laminate construction with high density copper wiring. The test probes (10) are attached to the first surface (12) of the substrate (11). The probes are used to electrically contact the aluminum bond pads (31) on the device (30) which is being tested. The device (30) under test, is preferably an IC chip. The bond pads (31) which are typically aluminum are typically recessed slightly below the surface of the passivation layer (32) of the integrated circuit device (30). The geometry of the compliant test probe (10) is optimized to provide a wiping contact interface to penetrate the oxides on the surface of the aluminum bond pads (31) to provide a low resistance connection.

The test probe (10) is attached directly to the fan out wiring (13) on the first surface (12) of the substrate (11) to minimize the resistance of the probe interface. The probe geometry is optimized to provide a flexible contact interface that controls the direction and length of the wiping action. The probe wire (15) is surrounded by a polymer material (72) that provides additional support and elasticity to the angled wire (15). The polymer material (72) preferably completely encases the probe wire (15) and the first surface (12) of the substrate (11) between the probes (10) with the exception of the probe tip (16). A thin layer of electrically conductive material (90) preferably covers the surface of the polymer material (72) surrounding the probe wire (15) to provide an individual ground shield for each of the probe wires (15). The electrically conductive material layer (90) is connected to ground terminals (92) on the surface (12) of the substrate (11). Grounding the electrically conductive material (90) substantially prevents cross talk between rapidly time varying electrical signals from inducing an undesired electrical signal on an adjacent probe conductor. The thickness and composition of the polymer material (72) can be varied to change the elastic and electrical properties of the high performance probe (10). As the compliant high density probe (10) is pressed against the IC device (30), the probe wire (15) rotates slightly and the probe tip (16) slides along the surface of the bond pads (31) of the IC device (30). The length of the sliding or wiping action is restricted by the angle and length of the probe wire (15) and the amount of compression of the probe (10). Since each of the probes (10) is separated from the adjacent probes, thermal expansion of the polymer material (72) is not a factor for high temperature applications such as burn-in. The polymer material (72) can be, for example, polyimide, polyamidimide and fluorinated polymers such as teflon.

Figure 2:
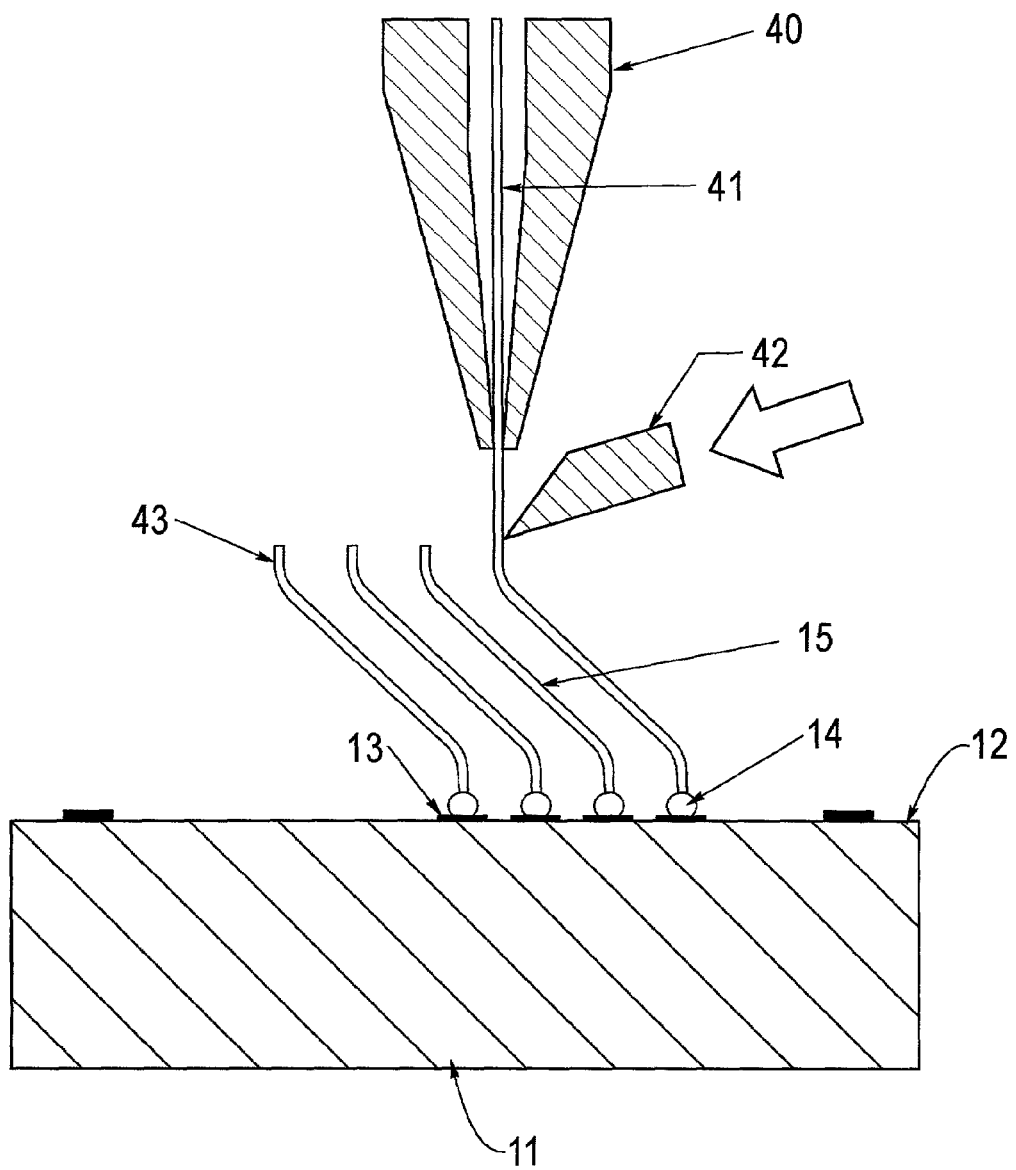
FIGS. 2-6 show the processes used to fabricate the compliant test probe on a fan out wiring substrate.

FIG. 2 shows a process used to fabricate the high performance test probe. A thermosonic wire bonder tool is used to attach ball bonds (14) to the fan out wiring (13) on the first surface (12) of the rigid substrate (11). The wire bonder tool uses a first ceramic capillary (40) to press the ball shaped end of the bond wire (41) against the first surface (12) of the substrate (11). Compression force and ultrasonic energy are applied through the first capillary (40) tip and thermal energy is applied from the wire bonder stage through the substrate (11) to bond the ball shaped end of the bond wire (41) to the fan out wiring (13) on the first surface (12) of the substrate (11). The bond wire (41) is positioned at an angle and a shear blade (42) is used to sever the bond wire (41) to create an angled segment of wire (15) protruding vertically from the ball bond (14). The movement of the ceramic capillary (40) is controlled during this process to provide a short straight section of the wire (43) that is perpendicular to the surface of the rigid substrate (11).

Figure 3:
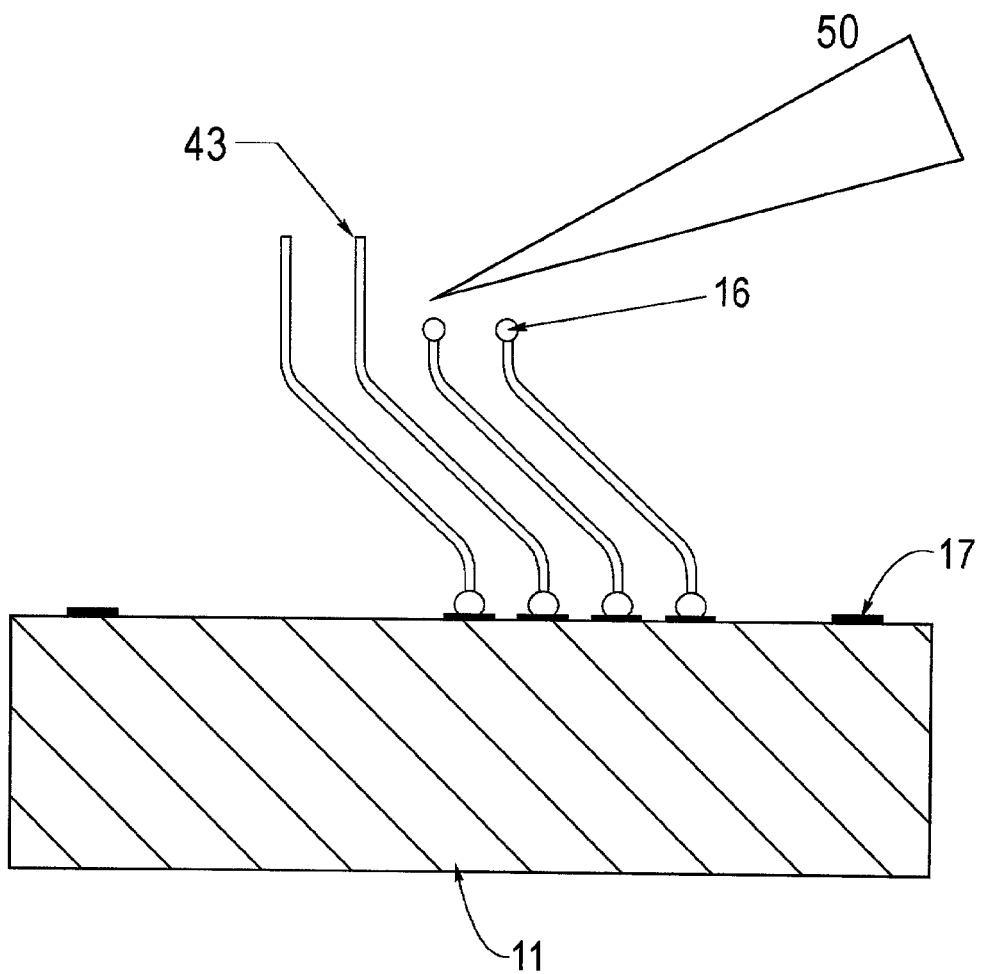

FIG. 3 shows (preferably an argon-ion) laser (50) used to melt the ends of the short straight sections of the wire (43) to create a ball shaped contact (16). The smooth surface of the ball shaped contact (16) is ideal for a wiping interface. The size of the ball shaped contact (16) on the end of the probe wire (15) is controlled by the laser power density and the alignment of the focal point from the tip of the straight wire section (43).

Figure 4:
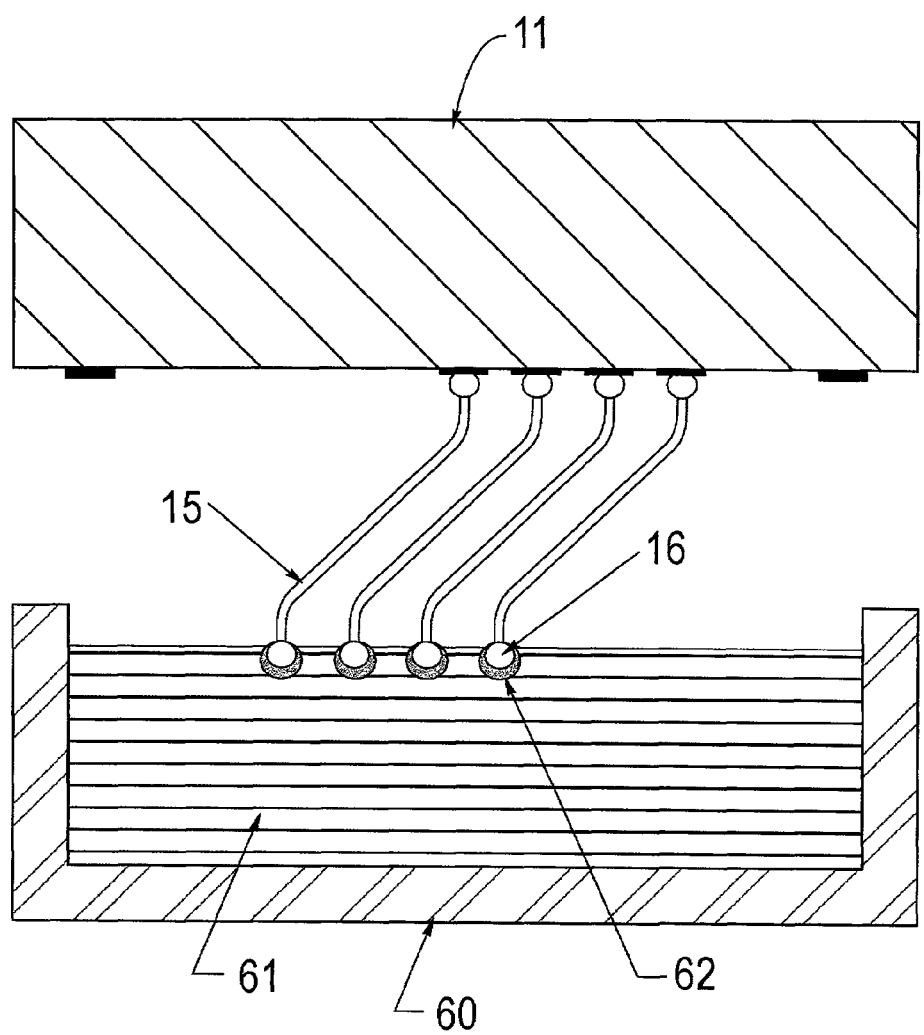
Figure 5:
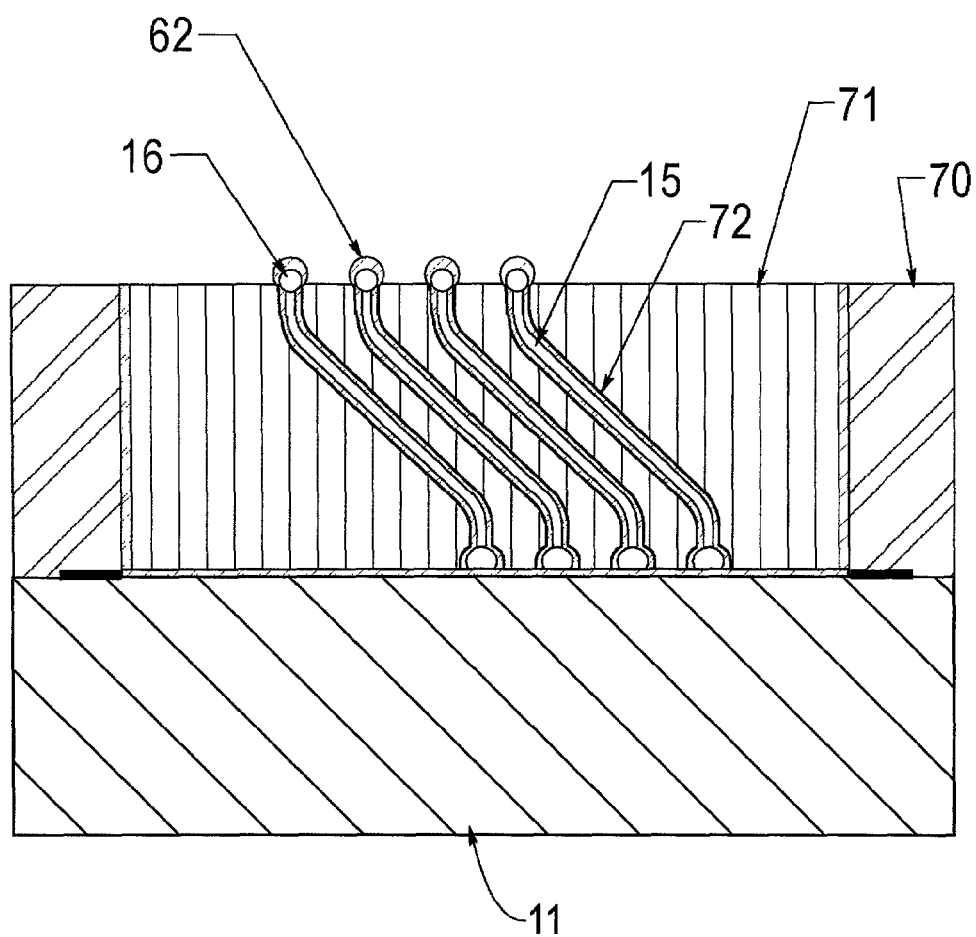

FIG. 4 shows the process used to coat the ends of the ball shaped probe contacts with a protective material (62). Protective material (62) can be a polymer such as polyimide, polyamide. The substrate (11) is positioned over the container (60) of liquid protective material (61) with the ball shaped contacts (16) submersed in the liquid (61). After the probe tips (16) are covered with the protective material (62), the substrate (11) is repositioned and a temporary dam (70) is placed around the array of probe wires (15) as shown in FIG. 5. The cavity formed by the temporary dam (70) is filled with a liquid polymer material (71) that produces a thin coating of polymer (72) on the probe wires (15). The process is controlled to create a conformal, uniform thickness of the polymer material such as paralyne (72) on each of the probe wires (15) and the first surface (12) of the substrate (11) between the probe wires (15). Alternatively, the probe structure (10) after depositing the protective coating (62) on the ends of wires (15), can be emersed into a solution while an electric potential is applied to the wires (15) to electrolytically deposit a polymer such as a polyimide onto the surface of the wires (15). Useful processes are described in U.S. Pat. Nos. 5,152,880 and 5,021,129, 5,242,713 and 5,242,551, the teaching of which is incorporated herein by reference.

As disclosed in U.S. Pat. No. 5,152,880, a polyimide is deposited onto a conductive substrate by providing a composition containing a cured (imidized) polyimide in its soluble, reduced form and an electrolyte and/or reducing agent, providing the substrate and a counter electrode in the composition, and providing an electrical bias between the substrate and counter electrode to thereby deposit the polyimide on the substrate. When a reducing agent is employed, it must have an oxidation potential that is negative with respect to the reduction potential of the polyimide. Compounds such as benzil anion, anthraquinone anion, benzophenone anion, benzoin dianion, sodium naphthalenide, anion of N,N'-di-n-butylpyromellitimide, tetrakis(dimethylamino) ethylene and even solvated electrons can be used as the reducing agent. Instead of or in addition to the solution containing the reducing agent, the solution may include an electrolyte, and preferably an electrolyte salt that contains as cation a member from one of the following groups: tetraalkylammonium, tetraalkylphosphonium, alkali metal, aryl-alkylammonium, or chelated metal. The electrolyte salt preferably contains as an anion one of the following: tetrafluoroborate, hexafluorophosphate, aryl sulfonate, perchlorate, or halide such as bromide or iodide. The solution containing the polyimide is preferably comprised of an aprotic solvent or solvent mixture. The polyimides that can be employed include unmodified polyimides, as well as modified polyimides such as polyester imides, polyamide-imide esters, polyamide-imides, polysiloxane-imides, as well as other mixed polyimides. Such are well-known in the prior art and need not be described in any great detail.

A method for forming the elongated electrical conductors, which constitute electrically conductive substrates, according to the present invention includes depositing a coating using a process which comprises providing a liquid composition containing a cured polyimide in its reduced form and a member selected from the group consisting of electrolyte, reducing agent and mixtures thereof, and wherein the reducing agent has an oxidation potential that is negative with respect to the reduction potential of the polyimide, providing an electrically conductive substrate in the composition, providing a counter electrode in the composition; and providing an electrical bias between the substrate and the counter electrode to thereby deposit the polyimide onto the electrically conductive substrate.

Figure 6:
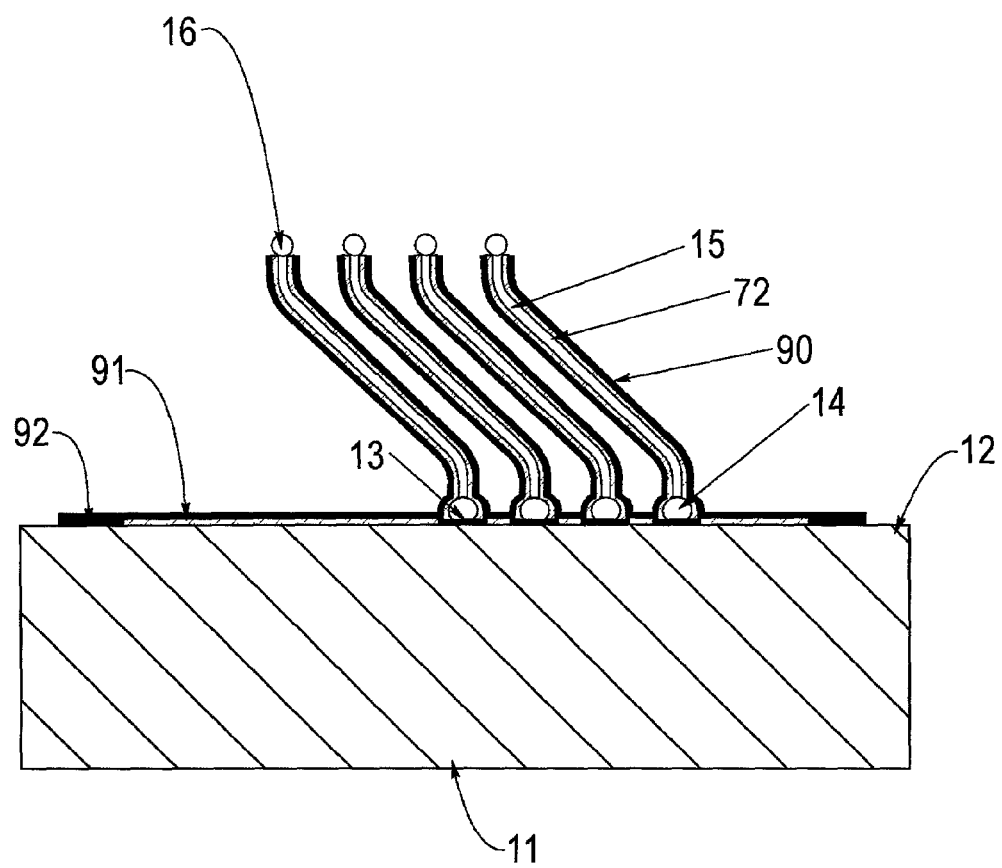

FIG. 6 shows the process step for adding the electrically conductive layer (90) on the surface of the polymer material (72). The conductive layer (90) can be added by electroless plating, electrophoretic plating, sputtering, or evaporation processes using palladium, chrome, copper, or other conductive materials. Conductive polymers can also be used as the ground layer (90) on the surface of the insulating polymer material (72). After adding the conductive layer (90), the protective coating (62) on the probe tips (16) is removed to expose the ball shaped contacts (16). Coating (62) can be a water soluble wax or other wax which can be later removed by commonly known techniques.

When an electroactive material such as polyimide is used for layer (72), electrically conductive layer (90) can be electrochemically deposited by the methods described in U.S. Pat. No. 5,242,713, the teaching of which is incorporated herein by reference. When a halogenated polymer material such as perflorinated polymer, such as Teflon (Dupont Registered Trademark) is used as dielectric layer (70), an electrically conductive layer can be electrochemically disposed thereon according to the teaching of U.S. Pat. No. 5,374,454, the teaching of which is incorporated herein by reference.

Figure 7:
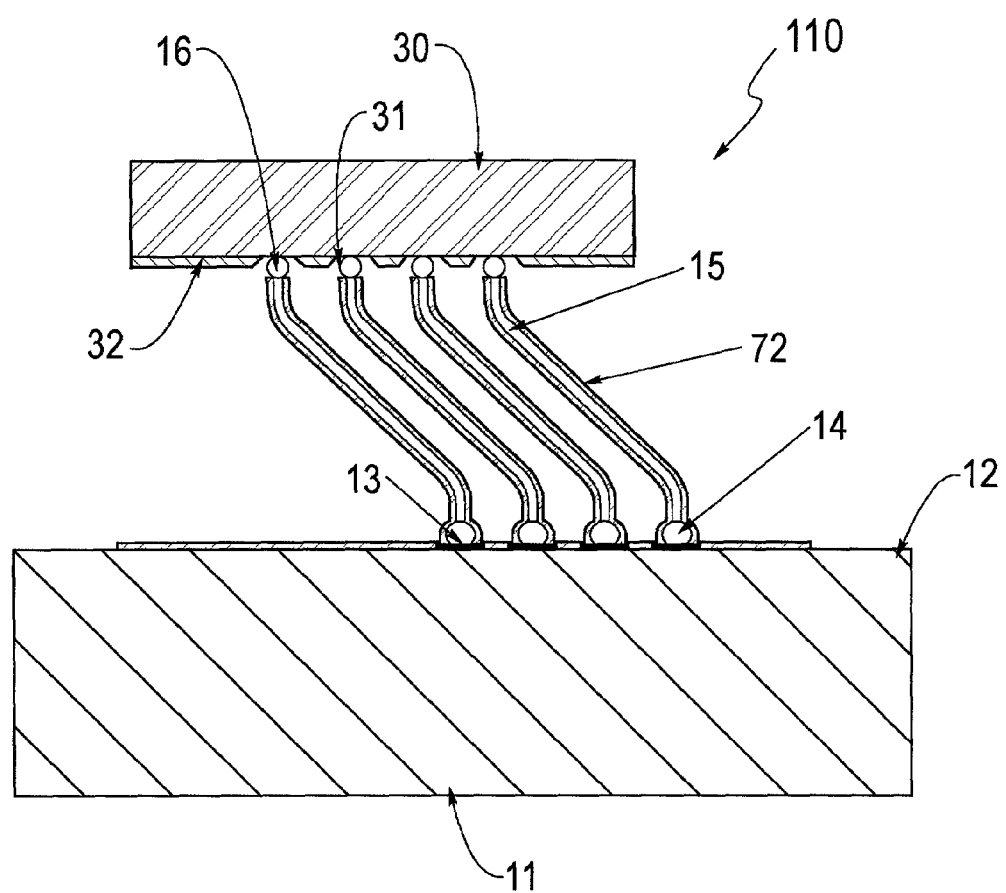
FIG. 7 shows a cross section of another embodiment of the high performance test probe.

FIG. 7 shows a cross section of another embodiment of the high performance test probe (110). This embodiment (110) uses the same construction as the embodiment (10) of FIG. 1 without the conductive layer (90) on the surface of the polymer material (72). While the electrical performance of this embodiment is not as good as the preferred embodiment, lower fabrication costs are the main advantage. In this embodiment the coating (72) can also be a material with high elasticity such as a stiff metal such as Invar, Cu/Invar/Cu, nickel which will enhance the flexibility of the elongated conductor (15).

Figure 8:
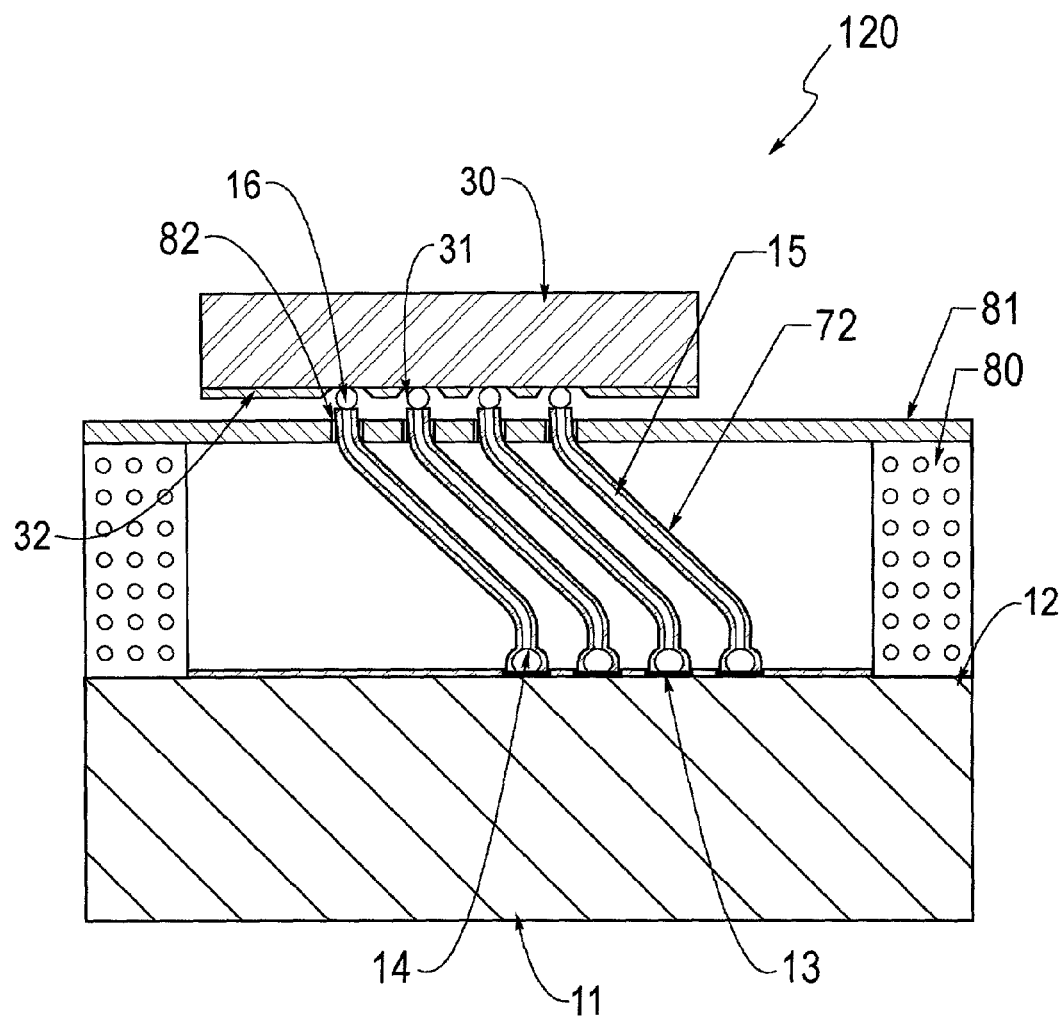
FIG. 8 shows a cross section of another embodiment of the high performance test probe.

FIG. 8 shows a cross section of another embodiment of the high performance test probe (120). This embodiment uses a thin sheet (81) (preferably Invar) to control the accuracy of the probe tip (16) positions. Sheet (81) can be any material such as a metal, a polymer, a glass and a ceramic. Invar is chosen to provide a TCE that is closely matched to the TCE of the silicon wafer IC (30) to be tested. Other materials with a TCE in the range of 2 to 8 ppm can also be used for the surface layer (81). A plurality of holes (82) are formed in the thin sheet (81) and are aligned with the corresponding probe tips (16). The thin Invar sheet (81) is supported by an elastomer frame (80) surrounding the array of probes. The thin invar sheet (81) can also be coated or laminated with a thin layer of polymer material on both the top and bottom sides to insulate the sheet (81) from the probe tip (16).

Figure 9:
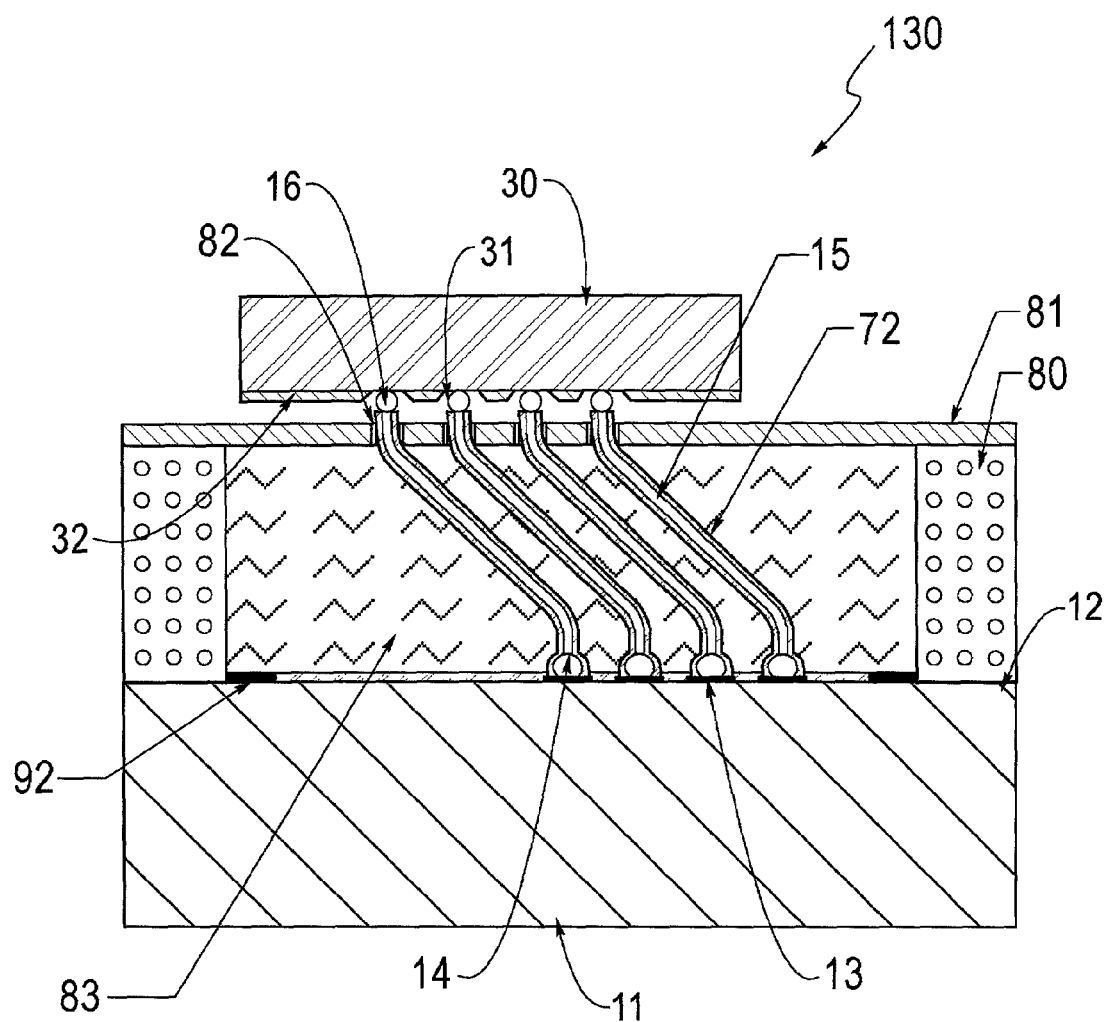
FIG. 9 shows a cross section of another embodiment of the high performance test probe.
Figure 10:
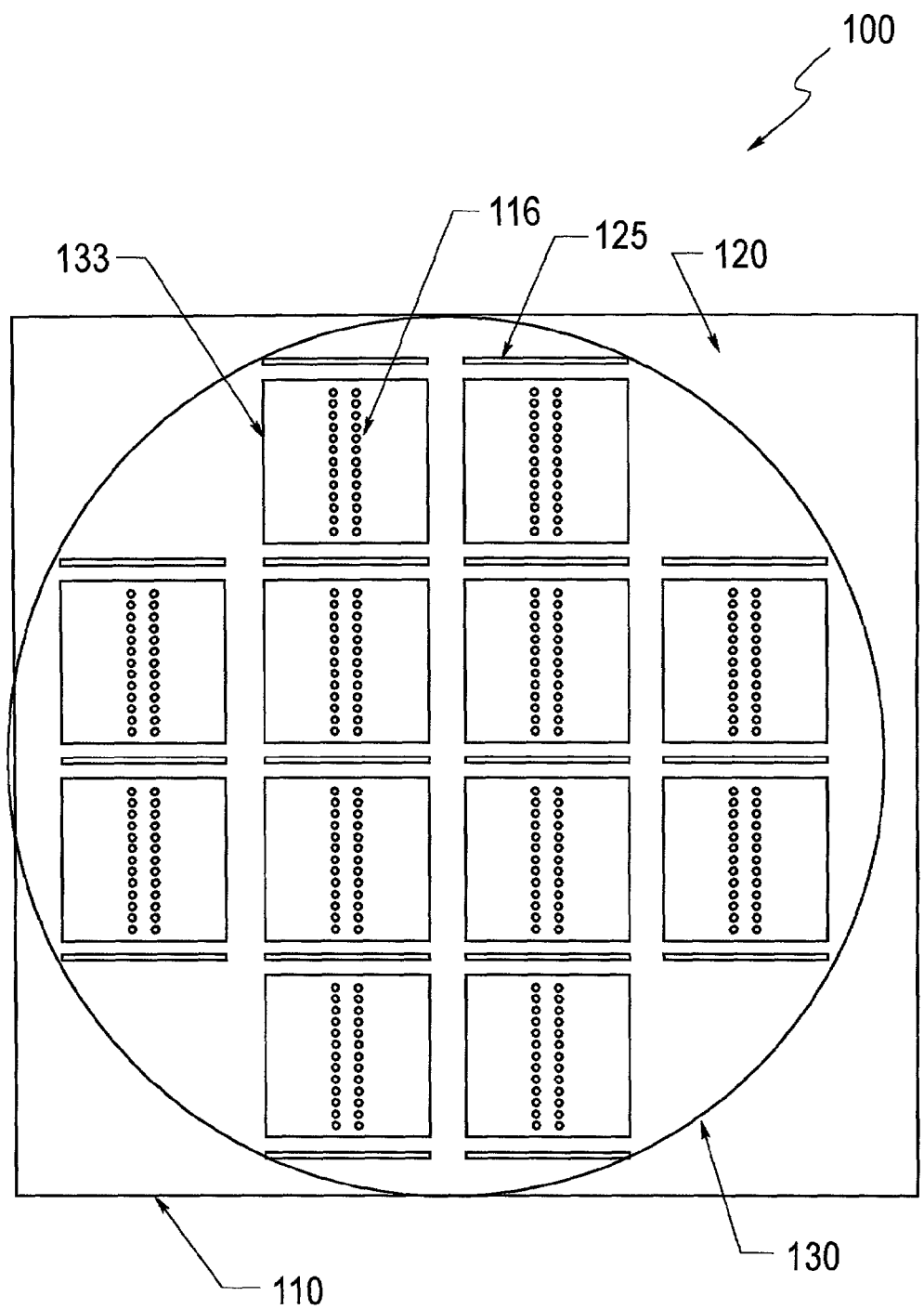
FIG. 10 is a top view of a probe structure showing clusters for chip sites on a wafer of chips.
Figure 11:
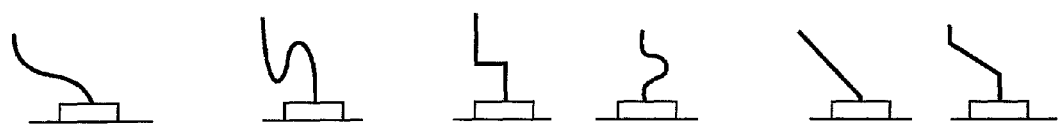
FIG. 11 schematically shares a variety of shapes of probe wires useful to practice the present invention, such as "S"

FIG. 9 shows a cross section of another embodiment of the high performance test probe (130). This embodiment is similar to the embodiment of FIG. 7 in that it uses a thin Invar sheet (81) to control the accuracy of the probe tip (16) positions. This embodiment also uses a compliant conductive polymer (83), such as conductive siloxane or a conductive foam elastomer, to fill the cavity between the probe wires (15) that is formed by the elastomer frame (80) and the thin sheet (81). The compliant conductive polymer (83) is in contact with a ground terminal (92) on the first surface (12) of the substrate (11) and provides a ground shield for each of the probe wires (15). Electrically conductive polymers are described in U.S. Pat. No. 5,198,153, the teaching of which is incorporated herein by reference.

Figure 15:
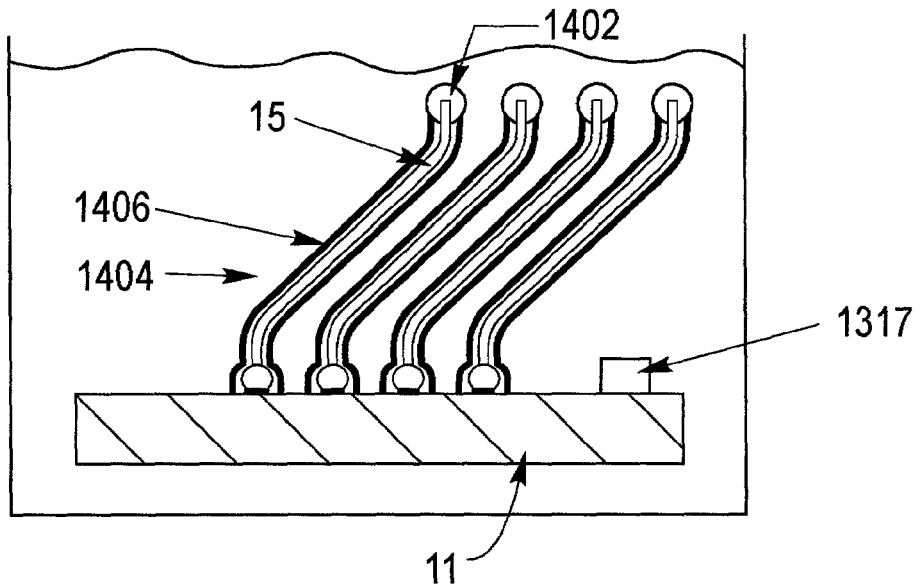
Figure 16:
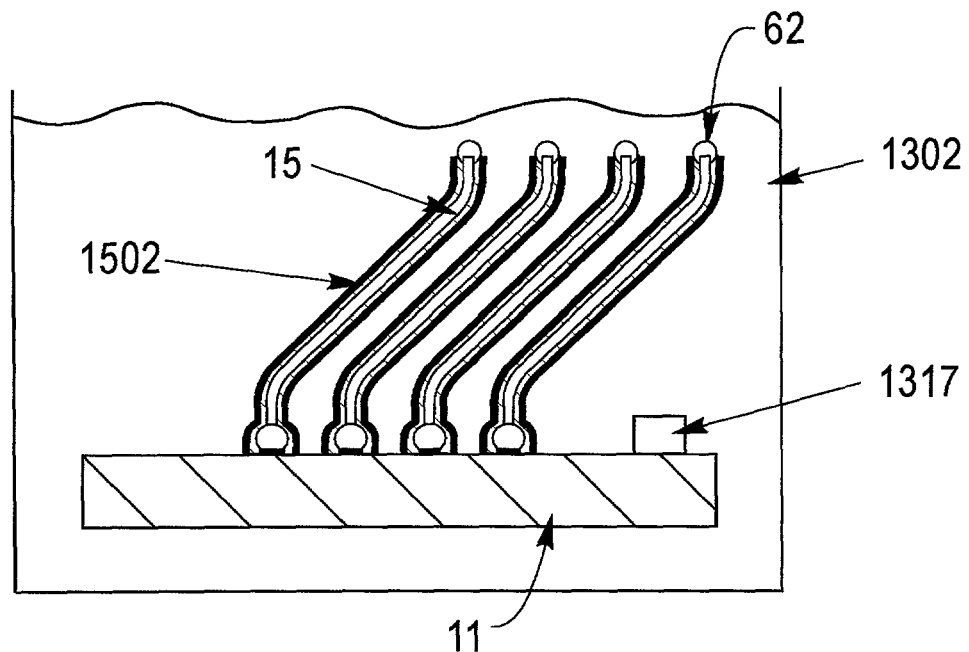

As shown in FIG. 13 a structure such as shown in FIG. 3 is immersed in a tank (1302) containing an electrolytic solution (1304) such as described in U.S. Pat. No. 5,152,880 to deposit a polyimide from polyimide solution or a polyimide from a polyisomide as described in U.S. Pat. Nos. 5,021,129, 5,242,713 and 5,242,551, the teachings of which are incorporated herein by reference. As described in these patents the appropriate currents and biases are applied to the wires (15) by applying the currents and voltages to contact pads such as contact pads (1317) which are electrically connected to each of the wires (15) to result in a polymer coating 1402 of FIG. 14. The structure 1404 of FIG. 14 with polymer coated wires (1406) can then be immersed in an electrolytic solution such as described in U.S. Pat. No. 5,242,713 to deposit a metal coating such as a copper coating on the polymer coating 1402. This can be achieved by replacing solution 1304 in FIG. 14 with the solution of U.S. Pat. No. 5,242,713 and applying the appropriate bias and current to contact 1317 to result in the structure of FIG. 15 with dielectric coating 1404 coated with electrical conductor 1502. When the structure of FIG. 15 is removed from tank 1302, protective layer 62 can be removed as described above to result in the structure of FIG. 16.

As described with reference to FIG. 9 the space between the elongated conductors can be filled with a material (1704). The material can be an electrically conductive polymer which provides a common electrical connection between electrically conductive layer (1502) on elongated conductors 15. The material 1704 can be electrically contacted by contact pad (1702). Alternatively, material 1704 can be a dielectric material filled with electrically conductive particles 1706 such as metal particles. Alternatively, material (1704) can be a blend of a dielectric polymer and an electrically conductive polymer. Alternatively, a sheet (1808) such as (81) of FIG. 9 can be disposed over the ends of the coaxial elongated conductor as shown in FIG. 18. Sheet (1808) can be an electrical conductor or a multilayer sheet having a dielectric and electrical conductor layer. Sheet (1802) can be bonded to outer conductor (1502) with an electrically conductive adhesive or solder bond at location (1804) to form a common electrical connection between the outer conductors (1402) of each coaxial elongated conductor (1806). Electrical contact can be made to sheet (1802) such as at 1810 to hold it at a fixed potential as described in the references incorporated herein by reference below. Substrate (11) can be designed so that electrically conductive pads (21) on surface (19) are electrically connected to elongated conductors (15) to thereby provide a bias for the electrochemical processes. Alternatively, as shown in FIG. 15 of the electrochemical deposition of electrically conductive layer 1502 is allowed to proceed long enough and if the electrically conductive pads (1902) shown in FIG. 19 are close enough the electrically conductive layers (1502) on adjacent elongated conductors (15) will bridge the gap between pads (1502) and merge as shown at location (1704) to form a common outer electrical conductor which can be biased to a common potential as shown at location (1906). Alternatively, in FIG. 14 protection layer (62) can be eliminated. If the center elongated conductor (15) is completely immersed in the solution of FIG. 13, the conductor (15) will be completely coated with dielectric layer (1406) and electrically conductive layer (1502). The coated ends of elongated conductor (15) are dipped into etchants to remove the layers 1402 and 1502 at the ends to result in the structure of FIG. 17. Alternatively, a laser can be used to burn off or volatilize the layers 1402 and 1502 at the ends of elongated conductors 15. Alternatively, these layers can be abraded away.

FIG. 17 schematically shows an apparatus for moving probe structure 10 towards and away from electronic device 204 so that probe tips 210 engage and disengage electrical contact locations 212 on electronic device 204. Probe 20 is mounted on to holder 200 having means 214 for applying electric power to the probe tips 210. Electronic device 206 is held on base 206. Holder 200 is physically connected to support 202 which is converted to arm 208 which is converted to base 206. Support 202 is adapted for use and down movement. Examples of an apparatus to provide the means for support and up and down movement can be found in U.S. Pat. Nos. 5,439,161 and 5,132,613, the teachings of which are incorporated herein by reference.

These electrically conductive polymers can be combined with elastomeric materials to form elastomeric electrically conductive polymeric materials.

Other embodiments of the high performance test probe are possible by changing the geometry of the probe wire or the probe tip. The probe wire can be angled, curved, or straight and the probe tip can be ball shaped, straight, or flattened.

The teaching of the following patent co-pending applications are incorporated herein by reference:
U.S. Pat. No. 5,371,654 entitled, "THREE DIMENSIONAL HIGH PERFORMANCE INTERCONNECTION PACKAGE";
U.S. patent application Ser. No. 08/614,417 entitled, "HIGH DENSITY CANTILEVERED PROBE FOR ELECTRONIC DEVICES";
U.S. patent application Ser. No. 08/641,667 entitled, "HIGH DENSITY TEST PROBE WITH RIGID SURFACE STRUCTURE";
U.S. patent application Ser. No. 08/527,733 entitled, "INTERCONNECTOR WITH CONTACT PADS HAVING ENHANCED DURABILITY";
U.S. patent application Ser. No. 081752,469 entitled, "FOAMED ELASTOMERS FOR WAFER PROBING APPLICATIONS AND INTERPOSER CONNECTORS";
U.S. patent application Ser. No. 08/744,903 entitled, "INTEGRAL RIGID CHIP TEST PROBE";
U.S. patent application Ser. No. 08/756,831 entitled, "HIGH TEMPERATURE CHIP TEST PROBE";
U.S. patent application Ser. No. 08/756,830 entitled, "A HIGH DENSITY INTEGRAL TEST PROBE AND FABRICATION METHOD";
U.S. patent application Ser. No. 08/754,869 entitled, "HIGH DENSITY INTEGRATED CIRCUIT APPARATUS, TEST PROBE AND METHODS OF USE THEREOF".

It is to be understood that the above described embodiments are simply illustrative of the principles of the invention. Various other modifications and changes may be devices by those of skill in the art which will embody the principles of the invention and fall within the spirit and scope thereof.

What is claimed is:

1. A method comprising providing a substrate having a surface;
   providing a plurality of elongated electrical conductors each having a first end and a second end;
   bonding each of said first ends to said surface so that said second ends are disposed away from said surface;
   electrochemically forming a dielectric coating on a portion of said elongated electrical conductors, comprising
       providing a liquid composition containing a cured polyimide in its reduced form and a member selected from the group consisting of electrolyte, reducing agent and mixtures thereof, and wherein the reducing agent has an oxidation potential that is negative with respect to the reduction potential of the polyimide,
       immersing said portion of said elongated electrical conductors in the composition,
       providing a counter electrode in the composition; and
       providing an electrical bias between the elongated electrical conductors and the counter electrode to thereby deposit the polyimide onto the elongated electrical conductors and form said dielectric coating;
   there being an exposed portion of said elongated electrical conductor at said second end that is not coated with said dielectric coating.

2. A method according to claim 1 wherein said dielectric coating is selected from the group consisting of unmodified polyimides, polyester imides, polyamide-imide esters, polyamide-imides and polysiloxane-imides.

3. A method according to claim 2 wherein said dielectric coating does not contain a metal constituent.

4. A method according to claim 1 wherein said elongated electrical conductors have a shape selected from the group consisting of linear, piece wise linear, curved and combinations thereof.

5. A method according to claim 4 wherein said dielectric coating does not contain a metal constituent.

6. A method according to claim 1 wherein said plurality of elongated electrical conductors are distributed into a plurality of groups.

7. A method according to claim 6 wherein said plurality of groups are arranged in an array.

8. A method according to claim 7 wherein each of said groups corresponds to an integrated circuit chip on a substrate containing a plurality of said integrated circuit chips.

9. A method according to claim 8 wherein said substrate containing said plurality of integrated circuit chips is a wafer of said integrated circuit chips.

10. A method according to claim 6 wherein said dielectric coating does not contain a metal consituent.

11. A method according to claim 1 wherein said method that forms a probe for an electronic device.

12. A method according to claim 11 wherein said electronic device is selected from the group consisting of an integrated circuit chip and a packaging substrate.

13. A method according to claim 1 further comprising:
retractably moving said second end towards and away from an electronic device so that said second ends contact electrical contact locations on said electronic device, and applying electrical signals to said elongated electrical conductors.

14. An apparatus according to claim 13 wherein said exposed portion at said second end is formed by not electrochemically forming a dielectric coating thereon.

15. A method according to claim 13 wherein said dielectric coating does not contain a metal constituent.

16. A method according to claim 1 wherein there is a protuberance at said second end.

17. A method according to claim 16 wherein said dielectric coating does not contain a metal constituent.

18. A method according to claim 1 wherein said forming a dielectric coating on said elongated electrical conductors is controlled to create said coating to be substantially conformal having a substantially uniform thickness said dielectric coating.

19. A method according to claim 18 wherein said exposed portion at said second end is formed by not electrochemically forming a dielectric coating thereon.

20. A method according to claim 19 wherein said dielectric coating does not contain a metal constituent.

21. A method according to claim 18 wherein said dielectric coating does not contain a metal constituent.

22. A method according to claim 1 wherein said exposed portion at said second end is formed by not electrochemically forming a dielectric coating thereon.

23. A method according to claim 1 wherein said dielectric coating does not contain a metal constituent.

* * * * *